(12) United States Patent
Kontson

(10) Patent No.: US 6,816,008 B2
(45) Date of Patent: Nov. 9, 2004

(54) QUASI-LINEAR MULTI-STATE DIGITAL MODULATION THROUGH NON-LINEAR AMPLIFIER ARRAYS

(75) Inventor: Kalle R. Kontson, McLean, VA (US)

(73) Assignee: Alion Science and Technology Corporation, McLean, VA (US)

( * ) Notice: Subject to any disclaimer, the term of this patent is extended or adjusted under 35 U.S.C. 154(b) by 0 days.

(21) Appl. No.: 10/331,930

(22) Filed: Dec. 31, 2002

(65) Prior Publication Data

US 2004/0124916 A1 Jul. 1, 2004

(51) Int. Cl.$^7$ ................................................ H03F 1/14
(52) U.S. Cl. ................ 330/51; 330/124 R; 330/124 P; 330/126; 375/261
(58) Field of Search ............................. 330/51, 124 R, 330/124 D, 126; 375/302, 261, 297

(56) References Cited

U.S. PATENT DOCUMENTS

| | | |
|---|---|---|
| 1,686,792 A | 2/1928 | Black |
| 3,896,395 A | 7/1975 | Cox ............................ 330/53 |
| 4,346,473 A | 8/1982 | Davis ......................... 371/43 |
| 4,571,549 A | 2/1986 | Lods et al. ............... 332/16 R |
| 4,675,619 A | 6/1987 | Uchibori et al. ........... 332/31 R |
| 4,804,931 A | 2/1989 | Hulick ...................... 332/31 R |
| 5,017,888 A | 5/1991 | Meinzer ..................... 330/295 |
| 5,175,871 A | 12/1992 | Kunkel ........................ 455/69 |
| 5,204,881 A | 4/1993 | Cardini et al. ................ 375/60 |
| 5,260,674 A | 11/1993 | Hulick ........................ 332/149 |
| 5,367,272 A | 11/1994 | Hulick ........................ 332/149 |
| 5,469,127 A | 11/1995 | Hulick et al. ................ 332/149 |
| 5,974,041 A | 10/1999 | Kornfeld et al. |
| 5,990,734 A | 11/1999 | Wright et al. ................... 330/2 |
| 5,990,738 A | 11/1999 | Wright et al. ............... 330/149 |
| 6,049,248 A | 4/2000 | Glas et al. ..................... 330/10 |
| 6,054,894 A | 4/2000 | Wright et al. ............... 330/149 |
| 6,064,264 A | 5/2000 | Tarsia et al. ................ 330/277 |
| 6,072,364 A | 6/2000 | Jeckeln et al. .............. 330/149 |
| 6,091,784 A | 7/2000 | Park et al. ................... 375/278 |
| 6,094,458 A | 7/2000 | Hellberg .................... 375/242 |
| 6,181,199 B1 | 1/2001 | Camp, Jr. et al. ............. 330/10 |
| 6,201,452 B1 | 3/2001 | Dent et al. .................. 332/103 |
| 6,240,142 B1 * | 5/2001 | Kaufman et al. .......... 375/261 |
| 6,272,336 B1 | 8/2001 | Appel et al. ................ 455/423 |
| 6,288,606 B1 | 9/2001 | Ekman et al. ................ 330/51 |
| 6,298,244 B1 | 10/2001 | Boesch et al. ............. 455/553 |
| 6,313,703 B1 | 11/2001 | Wright et al. ............... 330/149 |
| 6,320,913 B1 * | 11/2001 | Nakayama .................. 375/297 |
| 6,335,767 B1 * | 1/2002 | Twitchell et al. ........... 375/297 |
| 6,342,812 B1 * | 1/2002 | Abdollahian et al. ... 330/124 R |
| 6,351,500 B2 | 2/2002 | Kumar ....................... 375/270 |
| 6,359,506 B1 | 3/2002 | Camp, Jr. et al. ....... 330/124 R |
| 6,377,784 B2 | 4/2002 | McCune .................... 455/108 |
| 6,414,550 B1 | 7/2002 | Forbes ....................... 330/264 |

FOREIGN PATENT DOCUMENTS

JP 359168709 * 9/1984

OTHER PUBLICATIONS

Chrisikos et al. "Performance of Quadrature amplitude Modulation with nonlinear transmit amplifiers in Rayleigh fading" 2000 Radio & Wireless Conference, Sep. 10–13, 2000 pp 51–54.*

* cited by examiner

*Primary Examiner*—Michael B. Shingleton
(74) *Attorney, Agent, or Firm*—Staas & Halsey LLP

(57) ABSTRACT

At least one amplifier is selected from a first bank of non-linear amplifiers. At least one amplifier is selected from a second bank of non-linear amplifiers. The number of amplifiers selected from the first and second banks remains constant. Using the selected amplifiers, first and second components of a digital symbol are amplified using the first and second banks, respectively. The outputs produced by first and second banks are combined to produce an analog representation of the digital symbol.

16 Claims, 2 Drawing Sheets

US 6,816,008 B2

QUASI-LINEAR MULTI-STATE DIGITAL MODULATION THROUGH NON-LINEAR AMPLIFIER ARRAYS

BACKGROUND OF THE INVENTION

Modulation of a signal entails the use of a carrier wave and manipulation of the carrier by changing either the amplitude, frequency, phase, or other wave characteristics to convey intelligence to a remote receiver which demonstrates the wave to determine the content of the source of modulation. A simple example of modulation is Morse Code on a telegraph which interrupts a carrier to form short and long pulses having meaning to the receiver. Similarly, telephones change the amplitude of a wave in proportion to movement of a coil in an electrical circuit. The spoken voice causes a diaphragm to be displaced by compression and rarefaction of the air near the mouthpiece. The affected wave travels through a telephone line to a receiver and causes a speaker to react to the wave driving the speaker and reproducing speech.

Digital modulation converts an input into a string of 1's and 0's and changes a wave in such a manner as to represent these two states which may be interpreted at a receiver as a binary sequence. Early digital modulation schemes carried one bit (either a 1 or a 0) with each cycle. This could be done using a variety of modulation techniques.

Multi-level amplitude modulation-based schemes, such as M-ary Quadrature Amplitude Modulation (QAM) and M-ary Vestigial Sideband (VSB), offer large potential gains in spectrum efficiency. When each transmitted symbol has only two possible transmission states, each symbol can only carry one bit of information. On the other hand, if multiple transmission states are available, each transmitted symbol carries $\log_2 (M)$ binary bits, where M is the number of possible states. In other words, the number of bits n carried by a single symbol can be calculated from the number of possible states M with the following relationship $2^n = M$.

QAM is currently the most popular multi-level modulation scheme. 16 QAM (sixteen possible states for each symbol), 64 QAM (sixty four possible states for each symbol) and 256 QAM (256 possible states for each symbol) modulation systems are the currently used in point-to-point, high-capacity microwave systems. 512 QAM and 1024 QAM systems have been tested successfully and are beginning to appear. The currently used systems offer spectrum efficiencies of four ($2^4=16$) to eight ($2^8=256$) bits per cycle. With the current constraints on available spectrum, especially in mobile bands below 3 GHz, attaining spectrum efficiency is highly desirable.

M-ary QAM and other multilevel modulation schemes are used throughout the microwave bands for point-to-point fixed plant transmission. However, these modulation schemes have generally not been used in mobile radio communications. This is due largely to the need for higher signal-to-noise ratios and the commensurate higher power to achieve bit error performance. While much of this theoretical increase in required signal (and transmission power) can be negated by application of robust, digital error-correction schemes, there is a fundamental practical reason why QAM has not found support in the mobile radio communications application. Specifically, current multilevel modulation transmission techniques demand a lot of power. Mobile radio devices, however, have limited power. Consumers want small wireless phones that have a long battery life. To meet these important goals, the size of the mobile phone batteries is reduced and the power consumption of the phone is minimized. The minimized power is not sufficient to support current multilevel modulation transmission without adversely affecting battery life.

Current multilevel modulation demands a lot of power because linear amplifiers are used at the final RF stage. Multilevel modulation schemes, such as QAM, make slight changes in the transmitted symbols. The symbols are not simply "on" or "off." Very accurate, distortion-free transmission is required in order for multilevel modulation symbols to be accurately recognized at the receiver. Linear amplifiers at the final RF stage produce an amplified output signal which is directly proportional to the input signal. However, a linear amplifier operates in the linear area of the transistor power curve, between where the transistor is completely off and where the transistor is completely on. The transistor is always partially on. There is current flowing and heat dissipating even when no signal is being supplied. A substantial amount of energy is lost as heat, rather than producing radio frequency signals for the antenna.

Amplifiers are divided into classes. Classes A, B, and AB amplifiers are considered to be linear amplifiers. In view of their linear operation, the amplifiers of classes A, B, and AB have maximum power efficiencies of between 30% and 40%. Non-linear amplifiers, on the other hand, are not always partially on. They are either on or off. The amplifiers of Classes C, D and E are non-linear amplifiers. Non-linear amplifiers can achieve power efficiencies of between 60% and 90%. However, non-linear amplifiers produce an amplified output signal which may not be a proportional reproduction of the input signal. Thus, conventional wisdom has determined that non-linear amplifiers are not suitable for the required very accurate, distortion-free transmission of multilevel modulation schemes.

Since only linear amplifiers are used currently for M-ary QAM, the maximum efficiency currently attainable for M-ary QAM RF transmitters is between 30% and 40%. In mobile communications and satellite systems this demands two to three times the electrical energy battery capacity. Since battery capacity is somewhat related to battery size, this means larger batteries. Alternatively, for a given battery, conventional multilevel modulation schemes reduce battery life to one-half to one-third of the battery life for a modulation scheme having only two possible states. The impact on battery size and battery life has been one of the major limitations in the use of multilevel modulation schemes for mobile and satellite communications.

SUMMARY OF THE INVENTION

It is one possible object of the invention to enable to use of non-linear amplifiers for multilevel modulation schemes.

One way to possibly accomplish this goal is to select and activate at least one amplifier from a first bank of non-linear amplifiers. At least one amplifier is selected from a second bank of non-linear amplifiers. The number of amplifiers selected from the first and second banks remains constant. Using the selected amplifiers, first and second components of a phase modulated digital signal are amplified using the first and second banks, respectively. The amplifiers banks introduce amplitude modulation to each signal component by activating the selected amplifiers for the duration of a digital symbol. The outputs produced by first and second banks are combined to produce an analog representation of the digital symbol.

The first component may be phase shifted by 90° with respect to the second component. According to one alternative at all times during operation, one and only one amplifier is selected from each of the first and second banks of amplifiers. The first component may be an in-phase component of the digital symbol and the second component may be a quadrature phase component of the digital symbol.

There may be four amplifiers in the first bank of amplifiers and four amplifiers in the second bank of amplifiers. If there are m amplifiers in the first bank of amplifiers and n amplifiers in the second bank of amplifiers, then each QAM symbol produced by the combined array may carry r bits of data such that $2^r=(2m*2n)$.

Each amplifier of the first bank may have a different gain characteristic, and each amplifier of the second bank may have a different gain characteristic. In this case, the individual gain characteristics of the first bank may be the same as the individual gain characteristics of the second bank. The gain characteristics may be selected so as to provide an equal gain intervals between the amplifiers of each bank. In this manner, the individual amplifiers from the first and second banks may be chosen for operation based on their gain characteristics.

An amplifier device has first and second banks of non-linear amplifiers, a selection unit and a combination unit. The selection unit selects at least one amplifier from each of the first and second banks of non-linear amplifiers such that for each bank, the selected amplifier at least one amplifier produces an amplified output from a different component of a digital symbol, and such that the number of amplifiers selected remains constant. The combination unit combines the amplified outputs from the first and second banks. The first and second banks may be formed on an application specific integrated circuit chip.

A wireless telephone may be formed from the amplifier device, a telephone body, a speaker, a microphone, an antenna, and a transceiver. The amplifier device serves as the radio frequency amplifier within the transceiver.

According to another aspect, a modulation device has a Q-phase premodulator, an I-phase premodulator to respectively produce Q- and I-phase components. At least one non-linear Q-phase amplifier amplifies the Q-phase component and produces an output. At least one non-linear I-phase amplifier amplifies the I-phase component and produces an output. A combiner combines the outputs of the Q-phase and I-phase amplifiers.

The Q-phase component and the I-phase component may contain substantially no amplitude information. In this case, amplitude information is added in the Q-phase and I-phase amplifiers.

The combiner may produce an output signal that is fed to an antenna device with no intervening linear amplifiers. The combiner may produce an output signal that is sufficiently amplified for wireless transmission. The antenna device may be directly connected to the combiner. The combiner can comprise a simple impedance matching circuit with a direct connection to the antenna.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
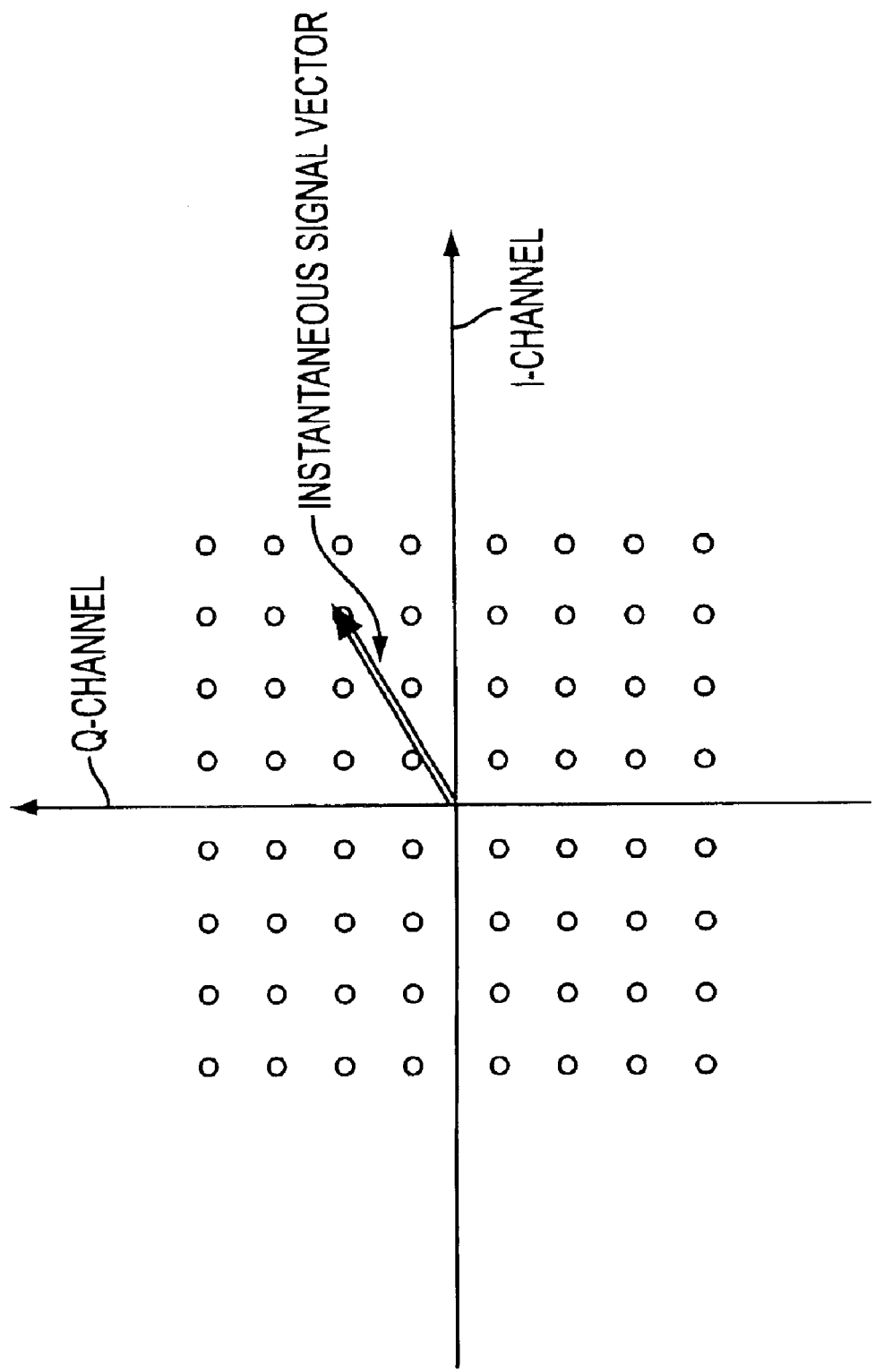
FIG. 1 is a constellation diagram for a 64 QAM signal.

Reference will now be made in detail to the preferred embodiments of the present invention, examples of which are illustrated in the accompanying drawings, wherein like reference numerals refer to like elements throughout.

For applications other than multilevel modulation, it has been proposed to use an array of non-linear amplifiers to simulate the signal produced by a single linear amplifier. Depending on the input signal and the desired output signal, one or more linear amplifiers from the array is selected. While this approach provides an improvement with regard to power consumption, it causes problems with regard to impedance matching. Specifically, the impedance of the amplifier array will depend on which amplifiers of the array are energized. During transmission, it is difficult to dynamically match an impedance that is changing.

Non-linear amplifiers generally have one impedance characteristic when the amplifier is operating ("an ON impedance") and one impedance characteristic when the amplifier is shut-off ("an OFF impedance"). Thus, each non-linear amplifier has two possible impedance characteristics. It has been found that these two impedance characteristics do not vary substantially from one non-linear amplifier to another. The present invention employs one or more array of non-linear amplifiers. Amplifiers within each array are selectively energized. The amplifiers are selected based on the input signal and the desired output signal. To avoid impedance matching problems, the number of amplifiers selected does not change. For example, if the array is designed to have two amplifiers operating at all times, the selected amplifiers will change, but the number selected will not.

Because the number of amplifiers energized and the number of amplifiers not energized is known in advance, the impedance can be calculated in advance. If one of four amplifiers is always energized and three of four amplifiers are always off, then the impedance is determined by a parallel circuit comprised of a single ON impedance and three OFF impedances.

Quadrature amplitude modulation (QAM) is one example of a multilevel modulation scheme. FIG. 1 is a constellation diagram for a 64 QAM signal. The constellation is formed from an 8×8 matrix of symbols shown on a two dimensional Euclidian grid. Each point in the matrix represents a signal state vector for one possible transmission state. With 64 points, there are 64 possible transmission states. Thus, FIG. 1 relates to 64 QAM modulation.

QAM signals have two different phase components. There is an in-phase component, (I-channel), which is represented on the x-axis. There is also a quadrature phase component, (Q-channel), which is represented on the y-axis. The phase of the resulting output signal is determined by the vector sum of the I and Q channels. The state diagram of FIG. 1 shows a vector sum of the I and Q channels.

In each quadrant of the FIG. 1 constellation, there are 16 possible signal states, for a total of 64 possible states in all four quadrants, each state representing a different 6-bit sequence. In order to correctly differentiate a signal state from the adjacent signal states, both the in-phase and the quadrature phase must be precisely amplified, with minimal distortion.

The translation of any given 6-bit sequence into a point in the FIG. 1 constellation is standardized. Stated another way, given any point in the constellation, the 6-bit sequence represented thereby is standardized. According to known 64 QAM techniques, a modulator translates a 6-bit sequence into a point within the constellation. Then, the modulator produces the I and Q phase components corresponding to the desired point. These phase components are combined, producing a complex, low power QAM signal. Downstream from the modulator, the low power QAM signal is amplified in one or more linear amplifiers, which are necessary because of the complexity of the signal. After amplification, the signal has sufficient power for wireless transmission.

Figure 2:
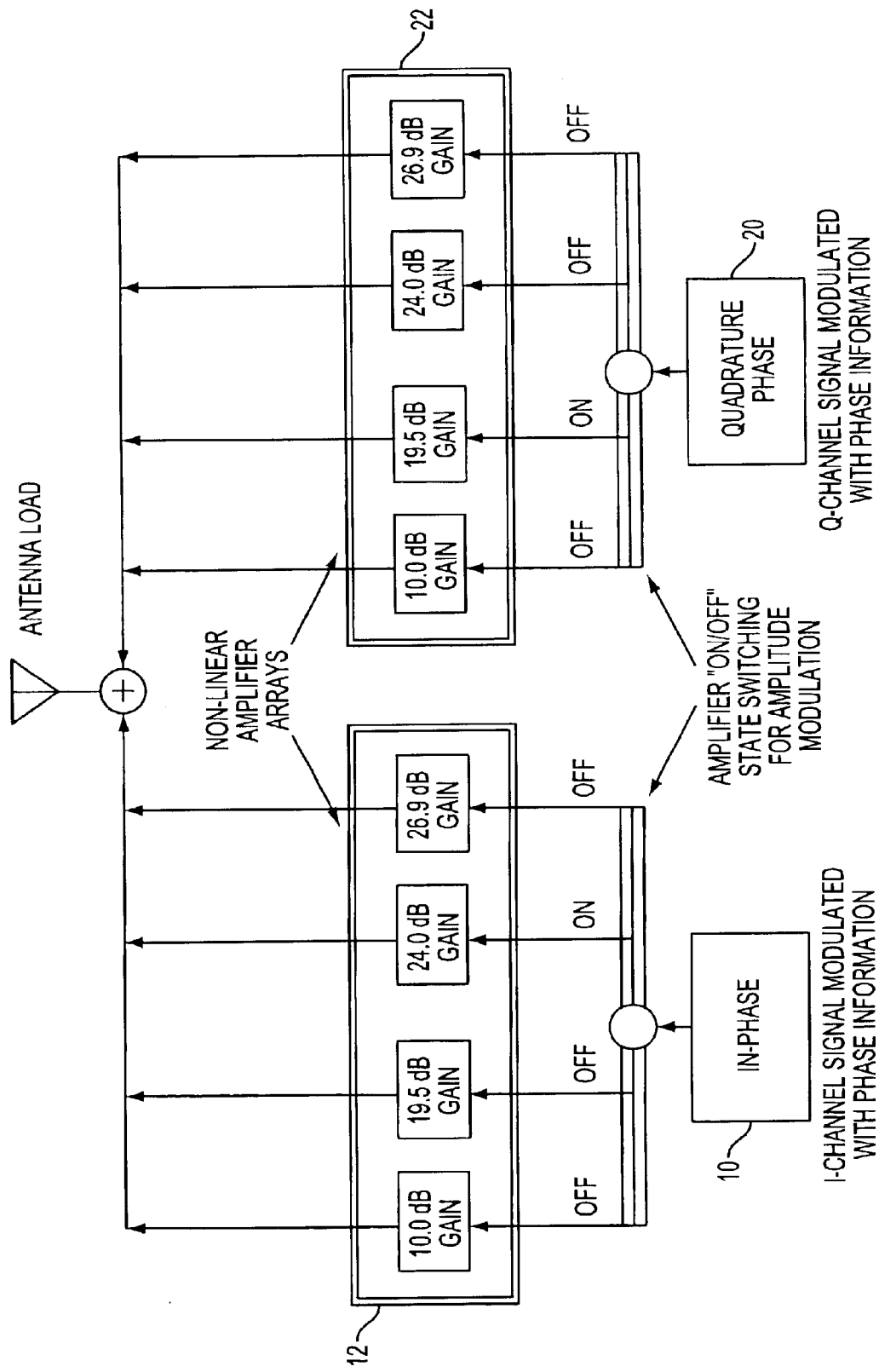
FIG. 2 is a schematic view of an amplification device according to one possible application of the present invention.

FIG. 2 is a schematic view of a modulation device according to one possible embodiment of the invention. The device shown in FIG. 2 acts as both the modulator and the final radio frequency amplifier before an antenna or antenna array. FIG. 2 relates to 64 QAM, but the invention is certainly not restricted to this application. The device shown in FIG. 2 has two arrays of non-linear amplifiers. The array shown on the left is for the in-phase component, and the array shown on the right is for the quadrature phase component. According to this example, each array of amplifiers includes four amplifiers, for a total of eight amplifiers. Each individual amplifier has a specific gain, and thus produces a discrete, distinct level at the output. The individual amplifiers in the arrays can be Class C, D or E non-linear amplifiers.

To understand how the device shown in FIG. 2 operates, it may be useful to first understand the various signals supplied to the device and their significance. Unmodulated signals are supplied to an I phase premodulator 10 and a Q phase premodulator 20. The unmodulated Q-phase signal has a constant 90 degree phase bias relative to the unmodulated I phase signal. Thus, referring to FIG. 1, the Q-phase unmodulated signal varies along the y-axis, and the I phase unmodulated signal varies along the x-axis. Then, in each of the premodulators 10, 20, the signals are independently modulated with bi-phase modulation (+ or −180 degrees) to impose phase-state information. The 180 degree phase shift determines whether the resulting vectors are on the positive side or the negative side of origin. For the premodulators 10, 20, four separate signals are required. There are two different unmodulated signals and two different signals for modulation.

It is important to understand that the premodulators 10, 20 do not add amplitude information to the signals. The signals produced by the premodulators 10, 20 have a constant amplitude. Referring to FIG. 1, the premodulators 10, 20 each produce a same-sized vector which varies between above and below the origin (Q channel) or to the left and right of the origin (I channel). If the signals from the premodulators 10, 20 were simply combined, it would be impossible to produce the constellation shown in FIG. 1. Amplitude information is also necessary. Two banks of amplifiers 12, 22 vary the amount of amplification, add amplitude information and control the size of the I and Q phase vectors.

The amplifiers of each array (bank) 12, 22 are turned on and off (gated) to provide a discrete, quantized output. When the output of the in-phase array 12 is combined with the output of the quadrature phase array 22, a QAM RF output is produced. In order to avoid impedance matching problems, the number of amplifiers turned on within each array is constant. In the example shown in FIG. 2, at all times there is a single amplifier that is turned on and three amplifiers that are turned off. The RF amplifier shown in FIG. 2 plays a key role in modulating the amplitude of a signal so that the signal corresponds with one of the signal state vectors of FIG. 1.

The relative amplifier gains are determined by the relationship of the amplitude steps necessary to define the I and Q channels so that they combine to accurately reproduce the intended constellation shown in FIG. 1. The gain of the selected amplifier determines the length of the I or Q vector before combination. The gains of the individual amplifiers in the FIG. 2 amplifier arrays 12, 22 are selected to provide the equal steps for reproducing the QAM constellation. Comparing FIGS. 1 and 2, for example, the FIG. 2 amplifier gains at 10.0 dB, 19.5 dB, 24.0 dB and 26.9 dB (dB scale is logarithmic) produce four equal steps in the FIG. 1 array, extending in each direction from the origin.

The amplifiers provide equal spacing within each 4×4 array and between the arrays. Therefore, so that the spacing is not disturbed between the points on the left and right of the y-axis and on the top and bottom of the x-axis, each 10.0 dB amplifier provides half a step from the axis, so that together, a whole step is formed. The second amplifier, the 19.5 dB amplifier, provides 3 times the amplification of the 10.0 decibel amplifier. Similarly, the 24.0 and 26.9 dB amplifiers respectively provide 5 and 7 times the amplification of the 10.0 amplifier.

The amplifiers in each array are turned on or off in accordance with the particular symbol being transmitted for that symbol duration. After being combined, the 64 QAM waveform is provided. For example, to produce the signal vector shown in FIG. 1, the third amplifier (24.0 dB gain) of the I-phase bank 12 is turned on while all the other I-phase bank amplifiers 12 are off, and the second amplifier (19.5 dB gain) of the Q-phase bank 22 is turned on while all the other Q-phase bank amplifiers 22 are off.

There are several different ways in which the amplifiers could selectively be turned on. One way is through back-gate switching of FET amplifiers. Each amplifier would receive an on-off signal. If the amplifier is to be turned off, a high negative bias could be applied to the back-gate. With no bias, or a positive bias, the amplifier is turned on. At any given time, there are two amplifiers in use, one amplifier from the I-phase bank of amplifiers 12, and one amplifier from the Q-phase bank of amplifiers 22.

One known way to achieve QAM amplification is to separately generate the quadrature phase and in-phase components (with amplitude information) of the signal and then combine them for subsequent amplification. The combination aspect remains in the FIG. 2 example. However, in FIG. 2, amplitude information is provided by the two banks of amplifiers 12, 22. To select an amplifier from each bank, a constellation point is divided into I-phase and Q-phase vector components. The amplitude information associated with the two vector components is then simply translated into a selection of an amplifier from each bank. When selected, the manner which the two amplifiers are turned on (and the other amplifiers are turned off) is a rather simple matter. The switching could perhaps be done by generating eight switching signals, one provided to the back-gate of each amplifier. While some inefficiency may result from unwanted coupling of amplifiers in the "off" state, it is expected that the efficiency of the overall device will approach the efficiency for a single non-linear amplifier, between 60% and 90%.

As should be apparent in the FIG. 2 example, the number of amplifiers required to produce an M-ary QAM waveform was determined by the dimensions of the desired constellation. The 64 QAM constellation shown in FIG. 1 has a four-by-four matrix in each quadrant. Therefore, four amplifiers are used for each of the I and Q channels. For a 256

QAM constellation, eight amplifiers could be used for each phase component.

With the simple implementation discussed above, the number of amplifiers determines the order of the modulation. In this case, only one amplifier of each bank is being used at the same time. It is also possible that more than one amplifier in each bank would be used simultaneously. For example, if all of the amplifiers in each of the FIG. 2 arrays 12, 22 were switched together, the 64 QAM modulation would be converted to a quadrature phase shift keying (QPSK) system. With QPSK there are four possible states for 2 bits rather than 64 possible states for 6 bits. Although the spectral channel use efficiency is less for QPSK than for 64-QAM, a noisier signal is permitted. 64 QAM requires a much higher signal to noise ratio. One possible implementation is to use higher order modulation (perhaps 64 QAM) when the signal to noise ratio is better, and use lower order modulation when the signal to noise ratio is worse. Switching between amplification techniques on the fly can create impedance matching problems, affecting the efficiency. Accordingly, it may not be desirable to switch modulation techniques on a per-symbol basis. However, switching less often, perhaps on a per-call basis, may be less problematic.

It may be difficult to produce an amplifier array from discrete amplifier components. The resulting device may be too large and/or heavy. To avoid this potential problem, the amplifiers can be arranged on one or more application specific integrated circuit (ASIC) chips. The ASIC embodiment may be particularly appealing for low power applications, such as handheld phones.

Switching modulation techniques, and varying the number of amplifiers simultaneously turned on, can add an upgrade capability to the chip. For example, the device shown in FIG. 2 could be incorporated into a wireless handset. If a wireless carrier had a 64 QAM capability, the chip would be set to a 64 QAM mode. Otherwise, the chip be set to a lower modulation mode, such as QPSK.

Still another alternative relating to more than one amplifier being simultaneously turned on relates to using two or more amplifiers to accomplish what is done by one amplifier in FIG. 2. For example, the FIG. 2 device could be altered such that two amplifiers in each bank are always turned on. Because the number is maintained constant at two, difficult impedance matching problems would not exist. In FIG. 2, the 10.0 dB amplifier could be separated into two equal sized, lower power amplifiers. This would also require that the gains of the 19.5, 24.0 and 26.9 dB amplifiers be reduced by a corresponding amount. There would be five amplifiers in each bank, rather than four. The first low power amplifier could always be turned on. Switching would continue between the remaining four amplifiers in a manner similar to that described above.

The invention has been described in detail with particular reference to preferred embodiments thereof and examples, but it will be understood that variations and modifications can be effected within the spirit and scope of the invention.

What is claimed is:

1. A method of amplification, comprising:
   selecting at least one amplifier from a first bank of non-linear amplifiers;
   selecting at least one amplifier from a second bank of non-linear amplifiers, such that selection of amplifiers from the first and second banks amplitude modulates an information signal;
   using the selected amplifiers, amplifying first and second components of a digital symbol using the first and second banks, respectively; and
   combining outputs produced by first and second banks to produce an analog representation of the digital symbol.

2. A method of amplification according to claim 1, wherein the first component is phase shifted by 90° with respect to the second component.

3. A method of amplification according to claim 1, wherein at all times during operation, one and only one amplifier is selected from each of the first and second banks of amplifiers.

4. A method of amplification according to claim 1, wherein there are four amplifiers in the first bank of amplifiers and four amplifiers in the second bank of amplifiers.

5. A method of amplification according to claim 1, wherein
   there are m amplifiers in the first bank of amplifiers,
   there are n amplifiers in the second bank of amplifiers, and
   each symbol carries r bits of data such that $2^r=(m*n)$.

6. A method of amplification according to claim 1, wherein
   each amplifier of the first bank has a different gain characteristic,
   each amplifier of the second bank has a different gain characteristic, and
   the individual gain characteristics of the first bank are the same as the individual gain characteristics of the second bank.

7. A method of amplification according to claim 6, wherein the gain characteristics are selected so as to provide equal gain intervals between the amplifiers of each bank.

8. A method of amplification according to claim 1, wherein the amplifiers from the first and second banks are selected based on the gain characteristics of the amplifiers.

9. An amplifier device for amplifying an information signal, comprising:
   a first bank of non-linear amplifiers;
   a second bank of non-linear amplifiers;
   a selection unit to select at least one amplifier from each of the first and second banks of non-linear amplifiers such that
      for each bank, the selected at least one amplifier produces an amplified output from a different component of a digital symbol, and
      selection of amplifiers from the first and second banks amplitude modulates an information signal; and
   a combination unit to combine the amplified outputs from the first and second banks.

10. An amplifier device according to claim 9, wherein there are four non-linear amplifiers in the first bank and four non-linear amplifiers in the second bank.

11. An amplifier device according to claim 9, wherein the first and second banks are formed on an application specific integrated circuit chip.

12. A wireless telephone, comprising:
   a telephone body, a speaker, a microphone, an antenna, and a transceiver, the transceiver having a radio frequency amplifier comprising:
   a first bank of non-linear amplifiers;
   a second bank of non-linear amplifiers;
   a selection unit to select at least one amplifier from each of the first and second banks of non-linear amplifiers such that
      for each bank, the selected at least one amplifier produces an amplified output from a different component of a digital symbol, and selection of amplifiers from the first and second banks amplitude modulates an information signal; and a combination unit to combine the amplified outputs from the first and second banks.

13. An amplifier device, comprising:

a plurality of Q-phase amplifiers to selectively amplify a Q-phase component of an M-ary QAM signal and produce an output;

a plurality of I-phase amplifiers to selectively amplify an I-phase component of the M-ary QAM signal and produce an output; and a combiner to combine the outputs of the Q-phase and I-phase amplifiers, wherein amplifier selection within the Q-phase amplifiers and the I-phase amplifiers provides amplitude modulation for the M-ary QAM signal.

14. An amplifier device according to claim 13, wherein the combiner produces an output signal that is fed to an antenna device with no intervening linear amplifiers.

15. An amplifier device according to claim 13, wherein the combiner produces an output signal that is sufficiently amplified for wireless transmission.

16. An amplifier device according to claim 13, further comprising an antenna device directly connected to combiner.

* * * * *

UNITED STATES PATENT AND TRADEMARK OFFICE
CERTIFICATE OF CORRECTION

PATENT NO. : 6,816,008 B2
DATED : November 9, 2004
INVENTOR(S) : Kalle R. Kontson It is certified that error appears in the above-identified patent and that said Letters Patent is hereby corrected as shown below:

Column 8,
Line 17, change "$2^r =(mn)$" to -- $2^r = (mn)$ --.

Column 9,
Lines 2 and 3, insert paragraph break between "; and" and "a".

Signed and Sealed this

Sixteenth Day of August, 2005

JON W. DUDAS
*Director of the United States Patent and Trademark Office*